US006907129B2

(12) United States Patent
Mallinson

(10) Patent No.: US 6,907,129 B2
(45) Date of Patent: Jun. 14, 2005

(54) SYSTEM AND METHOD FOR DIGITAL VOLUME CONTROL

(75) Inventor: Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 10/733,204

(22) Filed: Dec. 9, 2003

(65) Prior Publication Data

US 2005/0047613 A1 Mar. 3, 2005

Related U.S. Application Data

(60) Provisional application No. 60/499,935, filed on Sep. 2, 2003.

(51) Int. Cl.[7] .................................................. H03G 7/00
(52) U.S. Cl. ....................... 381/106; 381/108; 381/109; 700/94
(58) Field of Search ................................. 381/106, 108, 381/109

(56) References Cited

U.S. PATENT DOCUMENTS

| | | | | |
|---|---|---|---|---|
| 5,276,678 A | * | 1/1994 | Hendrickson et al. | ...... 370/267 |
| 5,615,234 A | * | 3/1997 | Brooks | ........................ 375/350 |
| 6,456,912 B1 | * | 9/2002 | Raynauld et al. | ............. 701/37 |
| 6,678,382 B2 | * | 1/2004 | Peterson | ...................... 381/104 |
| 2003/0182109 A1 | * | 9/2003 | Gonzalez et al. | ........... 704/225 |

* cited by examiner

Primary Examiner—Forester W. Isen
Assistant Examiner—A C Flanders
(74) Attorney, Agent, or Firm—Stevens Law Group

(57) ABSTRACT

A circuit and related method for digital volume control are provided, where the circuit includes a digital filter configured to process samples of an input stream in a manner that processes a previous input sample during a time interval before a subsequent input sample, and outputs a series of exponentially decaying waveforms. The result is an exponential response to a volume change made by a user, where the change feels more pleasant and natural than a conventional linear response.

8 Claims, 3 Drawing Sheets

SYSTEM AND METHOD FOR DIGITAL VOLUME CONTROL

RELATED APPLICATION

This application claims priority of U.S. Provisional Patent Application Ser. No. 60/499,935, filed on Sep. 2, 2003.

BACKGROUND

In a digital audio system, where the sound is represented by a digital number, it is desirable to have a control with which uses may adjust up or down the volume level of the reproduced sound. Such a device may be considered the digital equivalent of the well known analog knob that adjusts the sound level in an analog audio component. In conventional systems, the adjustment to the volume by a user is linear. The human ear, however, perceives sound in an exponential manner. Therefore, adjusting sound in a linear manner, as is done in conventional sound systems, does not feel natural to a user. Therefore, there exists a need for a system and method for adjusting the volume of a sound system, where the change is done in an exponential manner, making it comfortable to a user. As will be seen, the invention provides such a system and method in an elegant manner, and also with a reduced number of circuit components.

SUMMARY OF THE INVENTION

A circuit and related method are provided that are configured to digitally control audio volume. The circuit includes a register configured to receive previous and subsequent samples of an input stream, and a digital filter configured to process the input stream in a manner that processes a previous input sample during a time interval before a subsequent input sample. By the time that the subsequent input sample arrives to the digital filter, the previous sample has been suppressed by the digital filter to essentially zero. The output of the digital filter is a series of exponentially decaying waveforms. The digital filter may be a single pole digital high pass filter configured to output a previous input sample of the input stream in an exponentially decaying manner, and, at the moment a subsequent input sample is received by the digital filter, the digital filter substantially instantaneously outputs the subsequent input sample.

In operation, the circuit receives an original input data stream, and generates a new stream of audio data by sampling the output of a high pass filter operating between samples of the original input data stream. The time constant of the high pass filter is configured such that the original sample has decayed to a level that is close to zero or substantially zero before a subsequent sample arrives. The duration of time of the output sample is linearly varied relative to the input sample with a user input parameter. The high pass filter is a single pole response, where output amplitude of the high pass filter is exponentially related to the duration of time. The result is an exponential response to a volume change made by a user, where the change feels more pleasant and natural than a conventional linear response.

DETAILED DESCRIPTION

Figure 1:
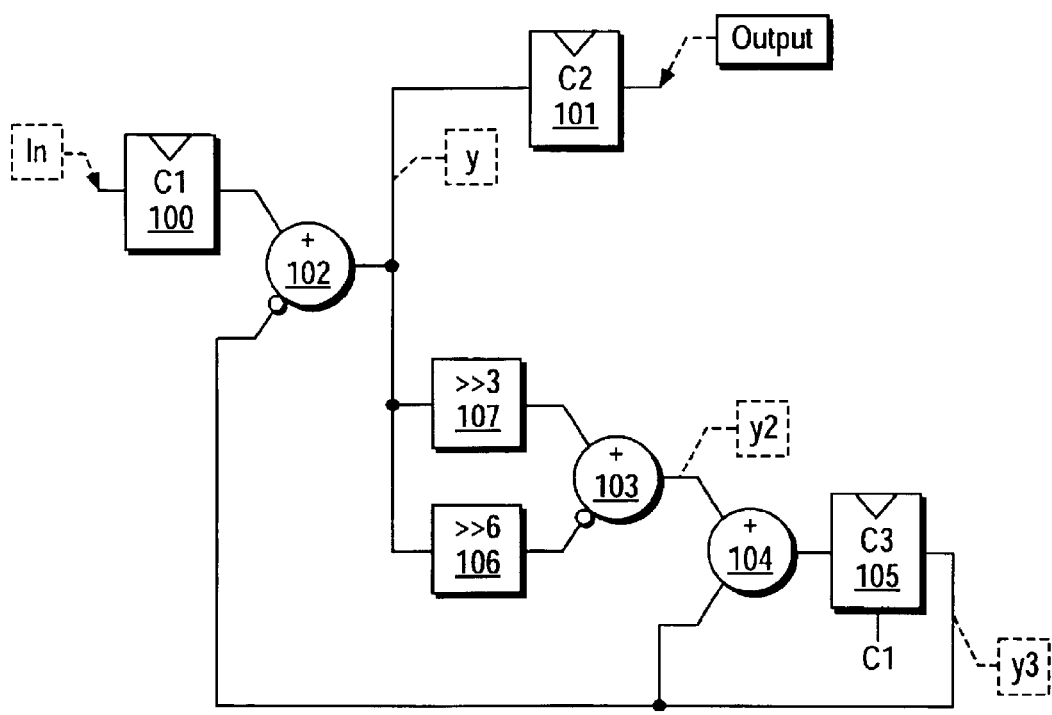
FIG. 1 is a diagrammatic view of one embodiment of the invention illustrating a high pass filter derived as an infinite impulse response ("IIR") filter.

The invention is directed to a circuit and related method for digital volume control. The circuit includes a digital filter configured to process samples of an input stream in a manner that processes a previous input sample during a time interval before a subsequent input sample, and outputs a series of exponentially decaying waveforms. One circuit embodying the invention includes a register configured to receive previous and subsequent samples of an input stream, and a digital filter configured to process the input stream in a manner that processes a previous input sample during a time interval before a subsequent input sample. By the time that the subsequent input sample arrives to the digital filter, the previous sample has been suppressed by the digital filter to essentially zero. The output of the digital filter is a series of exponentially decaying waveforms. The digital filter may be a single pole digital high pass filter configured to output a previous input sample of the input stream in an exponentially decaying manner, and, at the moment a subsequent input sample is received by the digital filter, the digital filter substantially instantaneously outputs the subsequent input sample. In operation, the register receives an original input data stream, and the circuit generates a new stream of audio data. This is done by sampling the output of a high pass filter operating between samples of the original input data stream. The time constant of the high pass filter is configured such that the original sample has decayed to a level that is close to zero or substantially zero before a subsequent sample arrives. The duration of time of the output sample is linearly varied relative to the input sample with a user input parameter. The high pass filter is a single pole response, where output amplitude of the high pass filter is exponentially related to the duration of time. The result is an exponential response to a volume change made by a user, where the change feels more pleasant and natural than a conventional linear response.

Digital audio data is represented by a sequence of integers—typically 24 bits in amplitude resolution and typically accessed at a rate of 44.1 khz (44100 such numbers are processed in one second). In high end audio applications that rate may be as high as 192 khz, (192000 number processed per second). Thus the audio signal may be considered to be a stream of data—the word "stream" implying a regular processing of the numbers in a fixed time interval. If the audio stream is represented as the numbers $A_1$, then to adjust the perceived volume level corresponds to replacing each of these integers by A'such that $A'_i = G \cdot A_1$. The factor G is then the adjustment made to each sample. If G=1 then no volume adjustment has been made and the digital audio component will then typically reproduce the audio output at the loudspeakers at a high level. The output will be heard as very loud. If the quantity G=0.5 the output will perceived as less loud, if G=0.25 the output will be perceived as again slightly less loud. As suggested by example, a digital volume control should be logarithmic in nature, because the human ear perceives sounds not linearly but logarithmically. This would make the user feel more comfortable in adjusting the volume of music, for example, where the change made by adjusting the volume feels more natural to the user.

For example, each halving of the factor G is perceived as a similar reduction in sound volume. Thus it is desirable to have a volume control where each step or adjustment of the volume control corresponds to a factor change in the quantity G. G can be expressed in decibel numbers as a number Gdb, where a decibel is defined as db=20·log(X) where X is typically an arbitrary ratio. For example, if the digital volume control were calibrated in units of decibels, a setting of Gdb=0 would correspond to G=1, a setting of Gdb=−1 would correspond to G=0.89125, since −1 db is $10^{-1/20}$= 0.89125, and a setting of Gdb=−2 would correspond to G=0.79433, since −2 db is $10^{-2/20}$=0.79433. As the factor Gdb is adjusted linearly from say 0 to −20 for example, the factor G=$10^{Gdb/20}$ changes exponentially and is perceived as a pleasant and natural change in volume level by the human ear. Thus, Gdb is the primary input parameter as requested by the user, by adjusting a knob or pressing a button for example, and the actual multiplier of the data in the stream G is derived from G=$10^{Gdb/20}$.

Without benefit of the invention, a digital volume control can be made by a digital multiplier element having inputs X and Y and output Z arranged such that Z=X*Y. For example, X considered the multiplicand could be connected to the successive values from the input stream of data A, and Y considered the multiplier connected to the controlling parameter G. The successive outputs Z then make up the adjusted stream A'. To adjust the volume, the logic or controlling processor would change the G parameter in a manner exponentially related to the input parameter Gdb as derived from the user input. Two components can be recognized in this straightforward implementation: that logic core or processor resource used to perform the multiplication of the stream element, and that logic or processor resource to pre-set the value of the multiplier G in a manner exponentially related to the primary input parameter Gdb.

According to the invention, these components of the volume control can be replaced by a single device having a much reduced complexity and hence a much reduced physical size of logic when compared to conventional implementations. In one embodiment, a sampled filter operating at a high rate inherently implements both aspects of a digital volume control. When a continuously varying analog quantity is represented as a stream of digital data, the resolution of the number used to encode one sample of the analog quantity may be determined from the acceptable quantization noise, for example, in audio systems, 24 bits of resolution are sufficient. The time between successive samples of the analog quantity is determined by the maximum frequency component that it is desirable to encode into the digital data stream. In audio systems this time interval is commonly 22.7 uS corresponding to a sampling frequency of 44.1 khz. This interval was chosen to be as long as possibly consistent with a tolerable bandwidth of audio signal. In recent conventional applications, the sampling frequency has been increased to as much as 192 Khz to render a higher fidelity audio signal having encoded frequency components as high as 70 khz. However, it will be observed that even the highest sampling frequency of 192 Khz remains much slower than the operating frequency of modern digital logic systems, which commonly operate as fast as 500 Mhz or more. It is therefore possible to complete many elementary logic operations in the interval between samples of the audio stream, and the invention exploits this capability.

Referring to FIG. 1, one implementation a high pass filter is derived as an infinite impulse response ("IIR") filter. The filter is constructed with input x and output y such that Δy=k(x−y) where k is conveniently $$\left(\frac{1}{8} - \frac{1}{64}\right) = 0.109375$$

so that, for each iteration of the filter, the parameter y is reduced by a factor 0.890625, which is −1.006 db. Still referring to FIG. 1, "C1" is the clock of the input data stream "In" and typically operates at 44.1 Khz. "C2" is the clock of the output stream "Out" which operates at the same frequency rate as "C1", but is delayed with respect to "C1". The signal "C3" is a clock operating at a substantially higher rate than "C1", typically 24 Mhz or more.

The stream of input samples is applied at the port labeled "In" and accepted into the register 100 on the positive edge of the clock "C1". At this time, the register 105 is set to zero on the same clock edge (C1). Thus, at this time, the signal "y", which is the output of adder 102, is equal to the input data just transmitted from the register 100 at the clock rate governed by clock input C1. Shifter elements 107 and 106 generate one eighth and one sixty-fourth respectively of the signal "y". Adder 103 generates the signal "y2". This y2 is one eighth of "y" minus one sixty-fourth of "y" or 0.109375·y. Adder 104 and register 105 form an integrator, where each cycle of the clock "C3" causes the signal "y3" to by incremented by the signal value of "y2". Each time clock "C3" clocks, the signal "y3" is incremented. As y3 is incremented, the signal "y" decreases. And, the amount by which "y3" increases is itself decreased. Thus "y3" can be seen to exponentially approach the value held in the register "C1". And, as it does so, the signal "y" exponentially decreases. Thus, according to the invention, a sigma delta loop can be configured such that, if an input signal has a small amplitude, it will operate as a fixed output "frequency of edges" loop with all the benefits of harmonic suppression. However, if the output signal were desired to be a high amplitude signal, a circuit configured according to the invention will gracefully drop the fixed frequency in order to create a large output. This tradeoff is useful in the design of audio systems that are required to produce a large output and yet need to have low distortion.

Figure 2:
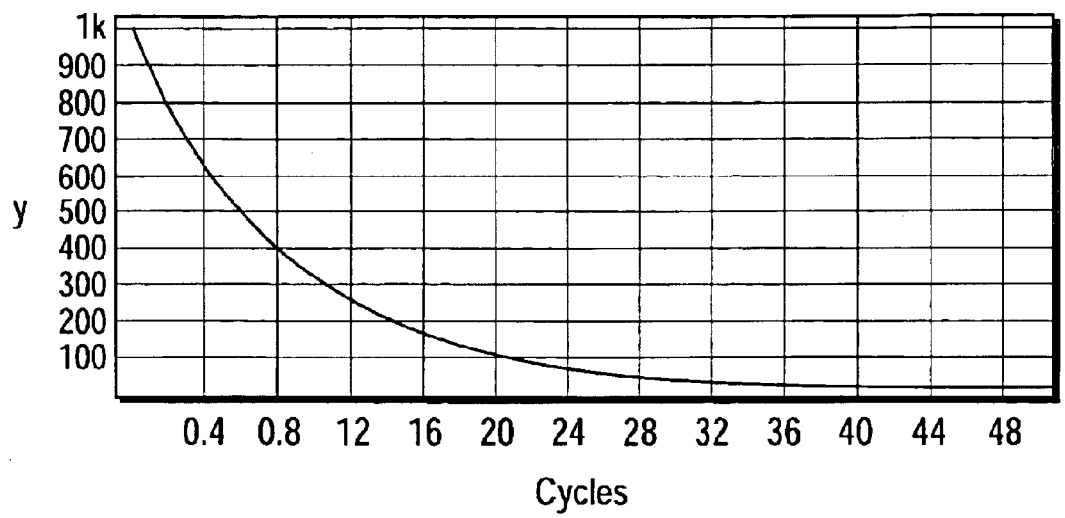
FIG. 2 is a graphical representation of the output of the high pass filter of FIG. 1, where the values are plotted to illustrate the output as an exponential decay.

For example, if the input has the value 1000 when the clock "C 1" occurs, then the y is initially 1000, the signal y2 is 110 and y3 is 0. When the first clock "C3" occurs, y3 will change to 110, y will change to 890, y2 will change to 98. When the second clock on "C3" occurs y3 will change to 208, y will change to 792 and y2 will change to 87. Repeating this sequence 20 times is seen to generate this sequence of values on "y": 1000, 890, 792, 705, 628, 559, 498, 443, 394, 351, 313, 278, 248, 220, 196, 175, 156, 139, 124, 110, 98 . . . etc. Referring to FIG. 2, the values are plotted to illustrate the output to be an exponential decay, beginning from the initial value of 1000, eventually decaying down to a value of substantially zero.

Each clock of "C3" causes the signal "y" to decrease by the factor 0.890625 because each time a fraction of "y" equal to (⅛−1/64) or 0.109375 is subtracted. This factor 0.890625 is constructed to be close to −1 db in fact it is −1.0061 db. Referring to the diagram above it can be seen that if "C2" is identical to "C1" the initial number as presented to the element 100 will be clocked into the output register 101. If however, the clock "C2" is delayed from "C1" by one cycle of "C3" then a number reduced from the input number by −1 db will be loaded into 101. In the example above clocking "C2" at the same time as "C1" will cause the number 1000 to appear at the output. Delaying the clock "C2" by one cycle of "C3" will load the number 890 into the register 101.

Figure 3:
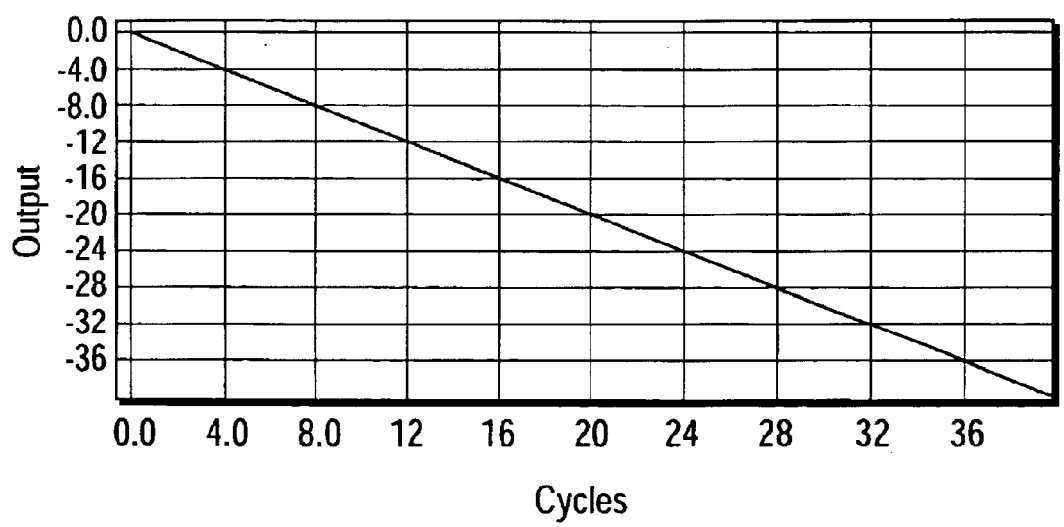
FIG. 3 is a graphical representation of an output of the high pass filter of FIG. 1, where the y-axis is measured in decibels relative to the initial input results to demonstrates that the circuit implements both parts of the required functionality.

Referring to FIG. 3, the graph can be interpreted as having an x-axis equal to the number of cycles of "C3" by which "C2" is delayed relative to "C1" and having a y-axis showing the value presented at the output. Plotting the y-axis in decibels relative to the initial input results is illustrated in the graph shown in FIG. 3. This demonstrates that the circuit implements both parts of the required functionality, where the input parameter is the number of cycles of "C3" that occur between "C1" and "C2", and where the output resented is a fraction of the input exponentially related to this input parameter. No multiplier or any explicit calculation of exponent has been required, which saves circuit components.

Figure 4:
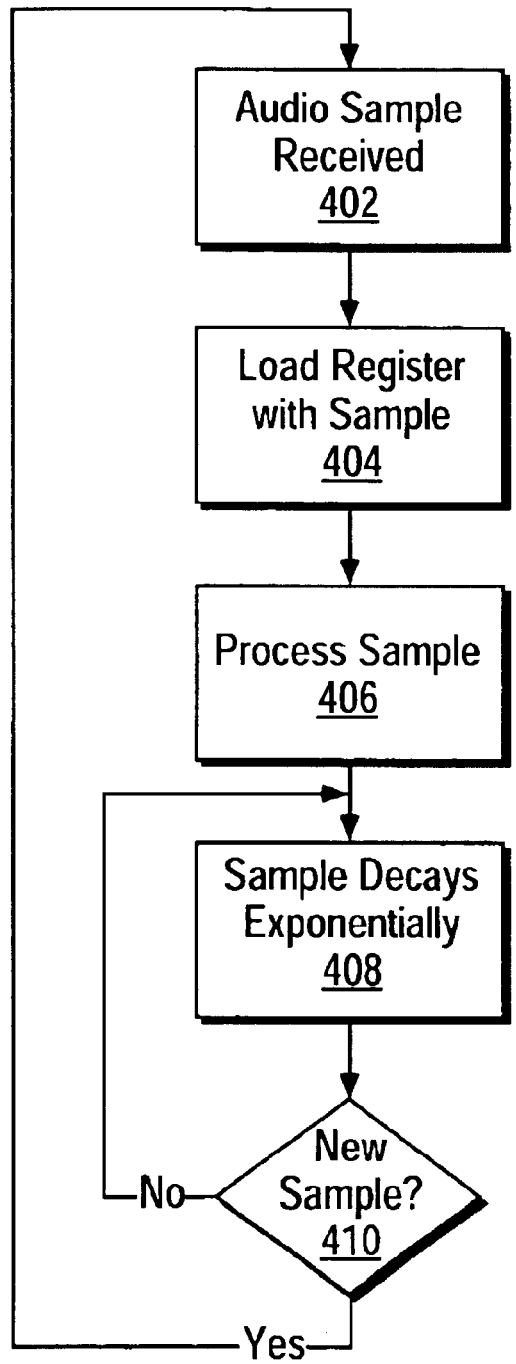
FIG. 4 is a flow chart illustrating a method according to the invention.

Referring to FIG. 4, the operation of a circuit embodying the invention is illustrated. In operation, in step 402, an audio sample is received. Upon receipt of a new audio input sample from the stream A, a register is loaded in Step 404 with the sample. In the interval 406, which occurs between this and the arrival of the next input audio sample, this number A is processed with a simple single pole digital high pass filter. In step 408, the signal output decays exponentially toward substantially zero, if given enough time and cycles. This continues in step 408, until a new sample is available in step 410, where the process returns back to step 402, where a new sample is received, and the process continues. The time constant of the high pass digital filter is arranged to be significantly shorter that interval between audio samples. Thus, by the time that the next audio sample arrives back in step 402, the previous sample has been suppressed at an exponential rate by the high pass filter toward zero in step 408. The waveform of the digital high pass filter is a series of exponentially decaying waveforms. In one embodiment, at the moment the new audio sample arrives, the high pass filter output jumps instantaneously to this new audio sample value. The next sample then proceeds to decay in an exponential manner to a value of substantially zero some time before yet another audio sample arrives.

Therefore, if a new series of audio data samples is created by a sampling of the high pass filter output at the moment of the loading of the new sample, it will be an identical sequence to the original digital audio input stream. However, if a new series of audio data samples is created by sampling the high pass filter output a short time after the moment when it loads the new samples, this new output sequence will consist of samples of lower amplitude, because this is a sample that occurs later in time, and a way down the exponential decay process of the original input sequence.

In operation, a new stream of audio data is made by sampling the output of a high pass filter that operates between samples of the original input data stream. The time constant of the high pass filter may be arranged to be such that the sample has decayed to essentially zero before the next sample arrives. The user input parameter (notated as Gdb above) is used to linearly vary the time of the output sample relative to the input sample. The high pass filter is a single pole response, and its output amplitude is exponentially related to the time. Again, no multiplier is required, since no operation to create an exponentially related parameter for multiplication is required. The action of the high pass filter is sufficient to create an output of variable amplitude. And, as the time of the output sample is varied linearly, the amplitude of the output sample is varying exponentially.

Referring again to FIG. 1, a method of digitally controlling volume of an audio signal, includes receiving an audio input signal in a first register (100) on the positive edge of a first clock (C1); adding the input signal (In) to an integrated sum signal (y3); simultaneously generating derivative input signals (from shifters 106 and 107) using shifters; adding the simultaneously generated derivative input signals to generated a sum signal (y2); integrating the sum signal (y2) to generate the integrated sum signal (y3) in an integrator loop having a register (105) and second clock (C3), where each cycle of the second clock (C3) causes the integrated sum signal (y3) to by incremented by the signal value of the sum signal y2). Also, each time the second clock (C3) cycles, the integrated sum signal (y3) is incremented, and, as the integrated sum signal (y3) is incremented, the output signal (y)decreases, wherein the integrated sum signal (y3) exponentially approaches the value held in the first register (100), while the output signal (y) exponentially decreases.

The above description of the invention is directed to a sigma delta loop configured such that, if an input signal has a small amplitude, it will operate as a fixed output "frequency of edges" loop with all the benefits of harmonic suppression. However, if the output signal were desired to be a high amplitude signal, a circuit configured according to the invention will gracefully drop the fixed frequency in order to create a large output. This tradeoff is useful in the design of audio systems that are required to produce a large output and yet to have low distortion. The invention, however, is not limited to this sole embodiment, which is only intended to be illustrative of the invention, the scope of which is defined by the appended claims and all equivalents.

What is claimed is:

1. A circuit configured to digitally control audio volume, comprising:
   a register configured to receive previous and subsequent samples of an input stream;
   a digital filter configured to process the input stream in a manner that processes a previous input sample during a time interval before a subsequent input sample, wherein, by the time that the subsequent input sample arrives to the digital filter, the previous sample has been suppressed by the digital filter to essentially zero, and wherein the output of the digital filter is a series of exponentially decaying waveforms.

2. A circuit according to claim 1, wherein the digital filter is a single pole digital high pass filter configured to output a previous input sample of the input stream in an exponentially decaying manner, and, at the moment a subsequent input sample is received by the digital filter, the digital filter substantially instantaneously outputs the subsequent input sample.

3. A circuit according to claim 1, wherein the digital filter is a single pole digital high pass filter configured to output a previous input sample of the input stream in an exponentially decaying manner until the voltage value of the previous input sample is substantially zero, and, at the moment a subsequent input sample is received by the digital filter, the digital filter substantially instantaneously outputs the subsequent input sample in a similarly decaying manner.

4. A method of digitally controlling volume of an audio signal, comprising:
   receiving an original input data stream;
   generating a new stream of audio data by sampling the output of a high pass filter operating between samples of the original input data stream, wherein the time constant of the high pass filter is configured such that the original sample has decayed to essentially zero before a subsequent sample arrives;

linearly varying the duration of time of the output sample relative to the input sample with a user input parameter, wherein the high pass filter is a single pole response, where output amplitude of the high pass filter is exponentially related to the duration of time.

5. A method according to claim 4, wherein the operation of the high pass filter is sufficient to create an output of variable amplitude and, as the time of the output sample is varied linearly, the amplitude of the output sample varies exponentially.

6. A method according to claim 4, wherein the user input parameter is a user implemented volume adjustment.

7. A method of digitally controlling volume of an audio signal, comprising:

receiving an audio input signal in a first register (100) on the positive edge of a first clock (C1);

adding the input signal (In) to an integrated sum signal (y3);

simultaneously generating derivative input signals (from shifters 106 and 107) using shifters;

adding the simultaneously generated derivative input signals to generated a sum signal (y2);

integrating the sum signal (y2) to generate the integrated sum signal (y3) in an integrator loop having a register (105) and second clock (C3), where each cycle of the second clock (C3) causes the integrated sum signal (y3) to by incremented by the signal value of the sum signal (y2).

8. A method according to claim 7, wherein each time the second clock (C3) cycles, the integrated sum signal (y3) is incremented, and, as the integrated sum signal (y3) is incremented, the output signal (y)decreases, wherein the integrated sum signal (y3) exponentially approaches the value held in the first register (100), while the output signal (y) exponentially decreases.

* * * * *